United States Patent
Shin et al.

(10) Patent No.: US 9,298,290 B2
(45) Date of Patent: Mar. 29, 2016

(54) TOUCH SCREEN PANELS AND METHODS OF FABRICATING THE SAME

(71) Applicant: Electronics and Telecommunications Research Institute, Daejeon (KR)

(72) Inventors: Jaeheon Shin, Daejeon (KR); Kyung Hyun Kim, Daejeon (KR); Woo-Seok Cheong, Daejeon (KR); Rae-Man Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 577 days.

(21) Appl. No.: 13/717,769

(22) Filed: Dec. 18, 2012

(65) Prior Publication Data

US 2014/0015771 A1    Jan. 16, 2014

(30) Foreign Application Priority Data

Jul. 12, 2012  (KR) .................. 10-2012-0076267
Sep. 18, 2012  (KR) .................. 10-2012-0103353

(51) Int. Cl.
*G06F 3/041*  (2006.01)
*H01L 21/00*  (2006.01)
*G06F 3/044*  (2006.01)

(52) U.S. Cl.
CPC ............... *G06F 3/041* (2013.01); *G06F 3/044* (2013.01); *H01L 21/00* (2013.01); *G06F 2203/04103* (2013.01); *G06F 2203/04111* (2013.01); *Y10T 29/49105* (2015.01)

(58) Field of Classification Search
CPC ................... G06F 3/041; G06F 3/044; G06F 2203/04103; G06F 2203/04111; H01L 21/00; Y10T 29/49105
USPC ............... 345/173–174; 178/18.01–18.07
See application file for complete search history.

(56) References Cited

U.S. PATENT DOCUMENTS

| | | | |
|---|---|---|---|
| 2011/0027561 A1 | 2/2011 | Chang et al. | |
| 2011/0268936 A1* | 11/2011 | Kang | G06F 3/044 428/203 |
| 2012/0113021 A1* | 5/2012 | Liu | G06F 3/041 345/173 |
| 2013/0016054 A1* | 1/2013 | Cheong | G06F 3/044 345/173 |
| 2013/0266724 A1* | 10/2013 | Cheong | G06F 3/044 427/97.2 |
| 2013/0335344 A1* | 12/2013 | Han | C09J 133/066 345/173 |

OTHER PUBLICATIONS

Xing Yan et al., "Refractive-Index-Matched Indium—Tin—Oxide Electrodes for Liquid Crystal Displays", Japanese Journal of Applied Physics, Dec. 2009, pp. 120203-1-120203-3, vol. 48.

* cited by examiner

*Primary Examiner* — Rodney Amadiz
(74) *Attorney, Agent, or Firm* — Rabin & Berdo, P.C.

(57) ABSTRACT

Provided are touch screen panels with improved transmittance and methods of fabricating the same. the method may include preparing a substrate including a cell region and an interconnection region provided around the cell region, sequentially forming a first buffer layer and a second buffer layer on the substrate, the second buffer layer having a refractive index less than that of the first buffer layer, and forming a transparent electrode on the second buffer layer. The second buffer layer is formed of a SiOC material.

8 Claims, 6 Drawing Sheets

Fig. 5

| Thickness of ITO | Thickness range of SiOC | Refractive index range of the first buffer layer | Thickness range of the first buffer layer | Transmittance (@550nm) | Index matching (ΔR) |
|---|---|---|---|---|---|
| 20nm | 30~90nm | 1.6~2.7 | 3~90nm | >91% | <0.8% |
| 30nm | 40~70nm | 1.7~2.7 | 6~50nm | >90% | <0.8% |
| 50nm | 40~55nm | 1.8~2.5 | 10~35nm | >87% | <0.8% |
| 70nm | 9~39nm | 1.7~2.6 | 9~74nm | >85.5% | <0.9% |

TOUCH SCREEN PANELS AND METHODS OF FABRICATING THE SAME

CROSS-REFERENCE TO RELATED APPLICATIONS

This U.S. non-provisional patent application claims priority under 35 U.S.C. §119 to Korean Patent Application Nos. 10-2012-0076267 and 10-2012-0103353, filed on Jul. 12, 2012 and Sep. 18, 2012, respectively, in the Korean Intellectual Property Office, the entire contents of which are hereby incorporated by reference.

BACKGROUND OF THE INVENTION

This disclosure relates to a touch screen panel and a method of fabricating the same, and in particular, a touch screen panel with improved transmittance and a method of fabricating the same.

Recently, as electronic devices (e.g., computers and potable hand-held terminals) are becoming more common, a touch screen panel is widely used as an input device for inputting information. The touch screen panel may be generally classified into the types of resistive touch panels, capacitive touch panels, ultra-sonic touch panels, and infrared light touch panels.

The resistive touch panels may be configured in such a way that a position of a touch point is determined by sensing a voltage change between two transparent electrodes therein, which may be produced when a surface of the touch panel is pressed with a finger or other objects. The resistive touch panels have technical advantages such as low cost, high transmittance, feasibility of multi-touch, fast response speed, and small form factor, and thus, are widely used for PDAs, PMPs, navigation terminals, headsets, and so forth.

The capacitive touch panels may be configured in such a way that a position of a touch point is determined by sensing a capacitance change between electrode patterns, which may be generated when the touch screen is touched by an input unit from the outside.

The ultra-sonic touch panels may be configured in such a way that a position of a touch point is determined by sensing a change in propagation characteristics of an emitted ultrasonic wave, which may be caused by an input unit from the outside.

SUMMARY

Example embodiments of the inventive concept provide a method of fabricating a touch screen panel with improved transmittance.

Example embodiments of the inventive concept provide a touch screen panel with improved transmittance.

According to example embodiments of the inventive concepts, a method of fabricating a touch screen panel may include preparing a substrate including a cell region and an interconnection region provided around the cell region, sequentially forming a first buffer layer and a second buffer layer on the substrate, the second buffer layer having a refractive index less than that of the first buffer layer, and forming a transparent electrode on the second buffer layer. The second buffer layer is formed of a SiOC material.

In example embodiments, the forming of the second buffer layer may include performing a reactive sputtering process using a SiC material as a target, under an oxygen partial pressure condition of 1% to 40%.

In example embodiments, the transparent electrode may include an indium tin oxide (ITO) layer.

In example embodiments, the transparent electrode has a thickness of 10 nm to 100 nm.

In example embodiments, the first buffer layer may include a material of $TiO_2$, $Nb_2O_5$, $ZrO_2$, $Ta_2O_5$, or $HfO_2$.

In example embodiments, the first buffer layer has a thickness of 3 nm to 100 nm.

In example embodiments, the first buffer layer has a refractive index of 1.6 to 2.7.

In example embodiments, the second buffer layer has a thickness of 5 nm to 100 nm.

In example embodiments, the second buffer layer has a refractive index of 1.4 to 1.48.

In example embodiments, the first buffer layer, the second buffer layer, and the transparent electrode may be formed by a continuous deposition process.

In example embodiments, the transparent electrode may be formed on the second buffer layer to expose a portion of the second buffer layer, and a difference in reflectance between lights reflected from the transparent electrode and the exposed portion of the second buffer layer may be less than 1%.

According to example embodiments of the inventive concepts, a touch screen panel may include a first buffer layer and a second buffer layer sequentially stacked on a substrate, x-axis electrodes arranged along an x-axis direction on the second buffer layer, y-axis electrode cells spaced apart from the x-axis electrodes and arranged along a y-axis direction on the second buffer layer, insulating patterns covering the x-axis electrodes positioned between the y-axis electrode cells, and a bridge electrode provided on the insulating pattern to connect the y-axis electrode cells with each other. The second buffer layer may be formed of a SiOC material.

In example embodiments, the x-axis electrodes and the y-axis electrode cells may be formed of an indium tin oxide (ITO) layer.

In example embodiments, thicknesses of the x-axis electrodes and the y-axis electrode cells range from 10 nm to 100 nm.

In example embodiments, the first buffer layer may be formed of $TiO_2$, $Nb_2O_5$, $ZrO_2$, $Ta_2O_5$, or $HfO_2$.

In example embodiments, the first buffer layer has a thickness of 3 nm to 100 nm.

In example embodiments, the first buffer layer has a refractive index of 1.6 to 2.7.

In example embodiments, the second buffer layer has a thickness of 5 nm to 100 nm.

In example embodiments, the second buffer layer has a refractive index of 1.4 to 1.48.

BRIEF DESCRIPTION OF THE DRAWINGS

Example embodiments will be more clearly understood from the following brief description taken in conjunction with the accompanying drawings. FIGS. 1 through 5 represent non-limiting, example embodiments as described herein.

FIG. 1 is a plan view illustrating a touch panel according to example embodiments of the inventive concept.

FIG. 3 is a graph showing oxygen partial pressure dependency of SiOC transmittance, according to example embodiments of the inventive concept.

FIG. 4 is a graph showing a difference in transmittance between touch panels with and without an ITO layer.

FIG. 5 is a table exemplarily showing relationship among a thickness of the SiOC layer and a thickness and a refractive index of the first buffer layer.

Figure 1:
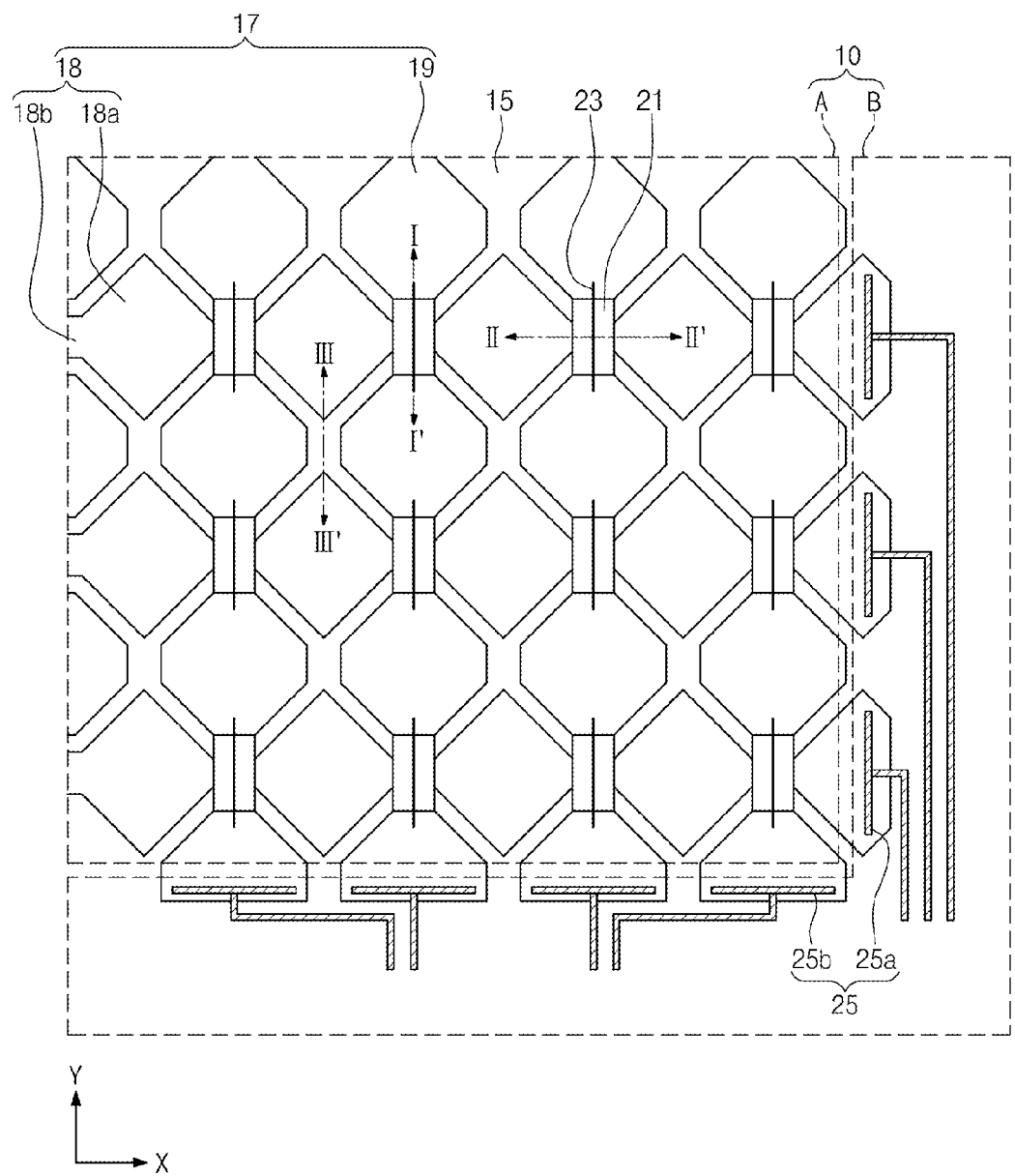

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a touch panel according to example embodiments of the inventive concept.

Figure 2A:
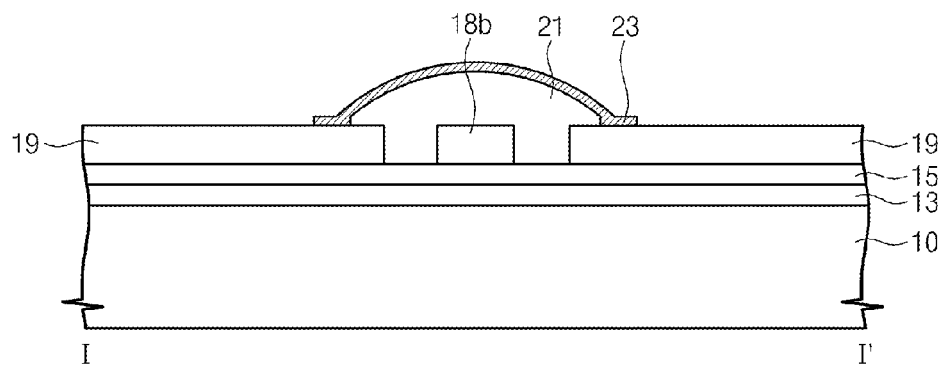
FIGS. 2A through 2C are sectional views taken along lines I-I', II-II', and III-III' of FIG. 1, respectively.
Figure 2B:
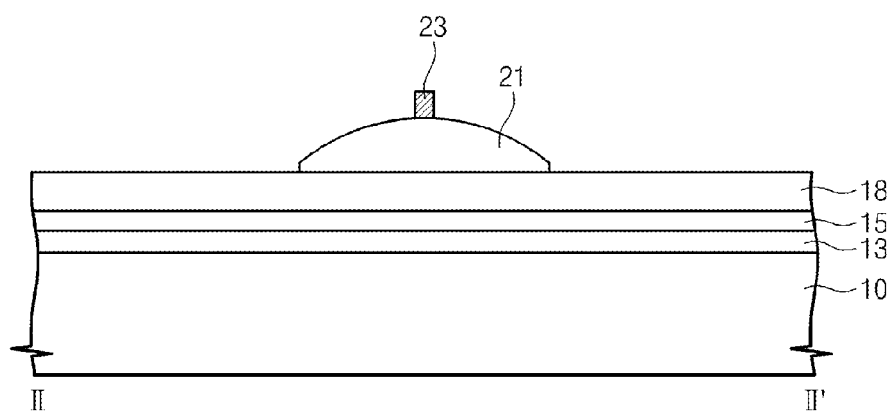
Figure 2C:
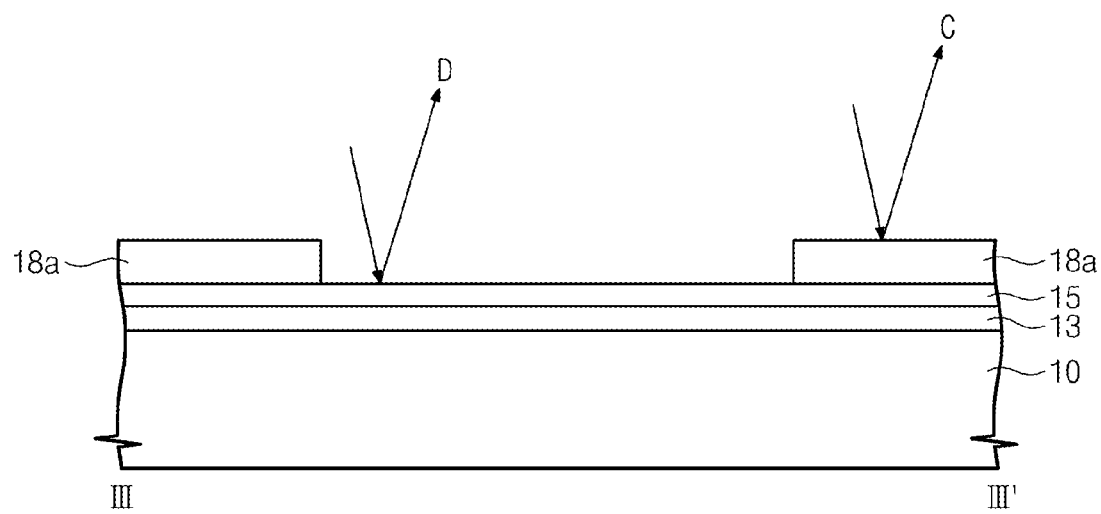

FIGS. 2A through 2C are sectional views taken along lines I-I', II-II', and III-III' of FIG. 1, respectively.

Referring to FIGS. 1 and 2A through 2B, a first buffer layer 13 and a second buffer layer 15 may be sequentially formed on a substrate 10.

The substrate 10 may include a cell region A and an interconnection region B provided around the cell region A. The substrate 10 may be one of a chemically-treated tempered glass substrate, a plastic substrate, a polycarbonate (PC) substrate coated with a film, and a polyethylene terephthalate (P.E.T) substrate. A thickness of the substrate 10 may range from about 3 nm to about 90 nm.

The first buffer layer 13 may be an insulating material having a high refractive index. For example, the first buffer layer 13 may be a transparent insulating layer having a refractive index of about 1.6 to about 2.7, for a light having a wavelength of about 550 nm. In example embodiments, the first buffer layer 13 may include a layer made of $TiO_2$, $Nb_2O_5$, $ZrO_2$, $Ta_2O_5$, or $HfO_2$. The first buffer layer 13 may have a thickness of about 3 nm to about 100 nm. The first buffer layer 13 may be formed by one of a physical vapor deposition, a chemical vapor deposition, and an atomic layer deposition.

The second buffer layer 15 may be an insulating material having a low refractive index. For example the second buffer layer 15 may be formed of a SiOC layer. The second buffer layer 15 may have a thickness of about 5 nm to about 100 nm. In example embodiments, the second buffer layer 15 may be formed to have a refractive index of about 1.40 to about 1.48. The second buffer layer 15 may be formed of a plasma-enhanced chemical vapor deposition or a reactive sputtering process. In the case where the second buffer layer 15 is formed using the reactive sputtering process, SiC may be used as a target material and oxygen partial pressure may be about 1% to about 40%.

A transparent conductive layer (not shown) may be formed on the second buffer layer 15. The transparent conductive layer (not shown) may be formed using one of a physical vapor deposition, a chemical vapor deposition, and an atomic layer deposition.

In the case where the substrate 10 of the touch panel is a large-area glass or film, the touch panel may be fabricated using a continuous deposition process. Here, the continuous deposition process may refer to a series of steps of sequentially and continuously depositing several materials on a substrate moving along a specific direction. The continuous deposition process may be, for example, an in-line process or a roll-to-roll process. Due to the use of the continuous deposition process, the first and second buffer layers 13 and 15 and the transparent electrode layer (not shown) may be sequentially formed on the substrate 10. In the case where a touch panel is fabricated using the continuous deposition process, it is possible to reduce cost and process time thereof and simplify a fabrication process thereof. However, since the continuous deposition process includes a plurality of deposition steps to be performed in their respective chambers, the chambers may need to be arranged adjacent to each other. Accordingly, at least one of the chambers may be polluted by a material to be used in other chamber.

In particular, magnesium fluoride ($MgF_2$) and silicon oxide ($SiO_2$) for the second buffer layer 15 may cause technical problems in the continuous deposition process. For example, the magnesium fluoride ($MgF_2$) may be formed by a sputtering or deposition process using $F_2$ gas at a high vacuum state, but the use of the $F_2$ gas may result in pollution of the chambers. For example, this pollution may lead to deterioration in film quality of the transparent electrode layer (not shown). Further, in the case where the silicon oxide ($SiO_2$) layer is formed by the sputtering process, it is necessary to supply oxygen gas in a oxygen partial pressure of 10% or more, due to a problem of slow deposition rate. However, such a high oxygen partial pressure may result in pollution of the chambers and deteriorate film quality of the transparent electrode layer (not shown).

By contrast, in the case where the second buffer layer 15 is formed of a silicon oxycarbide (SiOC) material during the continuous deposition process, the oxygen partial pressure may be reduced (for example, to 10% or less) and the pollution-causing gas (e.g., $F_2$) may not be used. Accordingly, the second buffer layer 15 can be deposited on the substrate 10, without pollution of the chambers. Furthermore, since the silicon oxycarbide (SiOC) layer may have a refractive index smaller than that (e.g., about 1.45-1.5) of silicon oxide ($SiO_2$), it is possible to improve transmittance of the touch panel.

After the first and second buffer layers 13 and 15 and the transparent electrode layer (not shown) are formed using the continuous deposition process, the transparent electrode layer (not shown) may be patterned to form a transparent electrode 17.

The transparent electrode 17 may include x-axis electrodes 18 and y-axis electrodes 19. The x-axis electrodes 18 and the y-axis electrodes 19 may be formed on the cell region A. The transparent electrode 17 may have a thickness of about 10 nm to about 100 nm. The transparent electrode 17 may be formed of an indium-tin-oxide (ITO) material.

The x-axis electrodes 18 may be arranged on the second buffer layer 15 along a first direction (or x-axis direction). The x-axis electrodes 18 may include x-axis electrode cells 18a and x-axis connection electrodes 18b. The x-axis electrode cells 18a may be formed to have a lozenge shape. The x-axis electrode cells 18a may be spaced apart from each other in a y-axis direction. The x-axis electrode cells 18a may be connected to each other in the x-axis direction by the x-axis connection electrodes 18b. Each of the x-axis electrode cells 18a may be formed to have one of lozenge, rectangular, square, and polygonal shapes.

The y-axis electrodes 19 may be arranged on the second buffer layer 15 along a second direction (e.g., y-axis direction) crossing the first direction. Each of the x-axis connection electrodes 18b may be disposed between a corresponding pair of the y-axis electrodes 19 spaced apart from each other in the second direction. The y-axis electrodes 19 may be formed spaced apart from the x-axis electrodes 18. The y-axis electrodes 19 may be formed to have a lozenge shape. But example embodiments of the inventive concept may not be limited thereto, and each of the y-axis electrodes 19 may be shaped like one of lozenge, rectangle, square, and polygon.

The x-axis electrodes 18 and the y-axis electrodes 19 may be spaced apart from each other to expose portions of the second buffer layer 15. Referring to FIG. 2C, an index matching may refer to a difference in reflectance between lights C and D, which are reflected from the transparent electrode 17 and the exposed portions of the second buffer layer 15, respectively. In the case where the index matching is less than 1%, the transparent electrode 17 may become invisible and the touch panel may be in a transparent state.

Insulating patterns 21 may be formed on the x-axis connection electrodes 18b to cover the portions of the second buffer layer 15 exposed by the x-axis connection electrodes 18b and the y-axis electrode cells 19. The formation of the insulating patterns 21 may include forming an insulating layer (not shown) on the substrate 10 provided with the x-axis electrodes 18 and the y-axis electrode cells 19, and then, patterning the insulating layer (not shown). The insulating layer (not shown) may be formed by one of a screen printing process, a physical vapor deposition, a chemical vapor deposition, and an atomic layer deposition. The patterning of the insulating layer (not shown) may be performed using, for example, a photolithography process and a wet or dry etching process. Each of the insulating patterns 21 may be formed to cover partially top surfaces of a corresponding pair of the y-axis electrode cells 19 spaced apart from each other by one of the x-axis connection electrodes 18b.

Each of the insulating patterns 21 may have an upward convex or uneven top surface. In example embodiments, the touch screen panel may be configured to sense electric capacitance, which may be caused by a change in a thickness of the insulating pattern 21. The insulating patterns 21 may be formed of one of SiOx SiNx, MgF2, SiOxNy, and an organic material.

Each of the bridge electrodes 23 may extend to cover top surfaces of the y-axis electrode cells 19, which may be disposed adjacent to each other at both sides of the insulating pattern 21. Accordingly, the bridge electrodes 23 may enable to connect the y-axis electrode cells 19, which are spaced apart from each other, electrically to each other. In example embodiments, the bridge electrodes 23 may be a single- and/or multi-layered metal structure (for example, including one of Mo, Al, Cu, Cr, Ag, Ti/Cu, Ti/Ag, Cr/Ag, Cr/Cu, Al/Cu, and Mo/Al/Mo).

The interconnection lines 25 may be formed on the interconnection region B of the substrate 10. Each of the interconnection lines 25 may include a driving line 25a connected to a corresponding one of the x-axis electrode cells 18 and a sensing line 25b connected to a corresponding one of the y-axis electrode cells 19. The interconnection lines 25 may be formed in such a way that the driving and sensing lines 25a and 25b are separated from each other by a specific space. In example embodiments, the metal interconnection lines 15 may be a single- and/or multi-layered metal structure (for example, including one of Mo, Al, Cu, Cr, Ag, Ti/Cu, Ti/Ag, Cr/Ag, Cr/Cu, Al/Cu, and Mo/Al/Mo). A voltage may be applied to the transparent electrode 17 via the interconnection lines 25.

Figure 3:
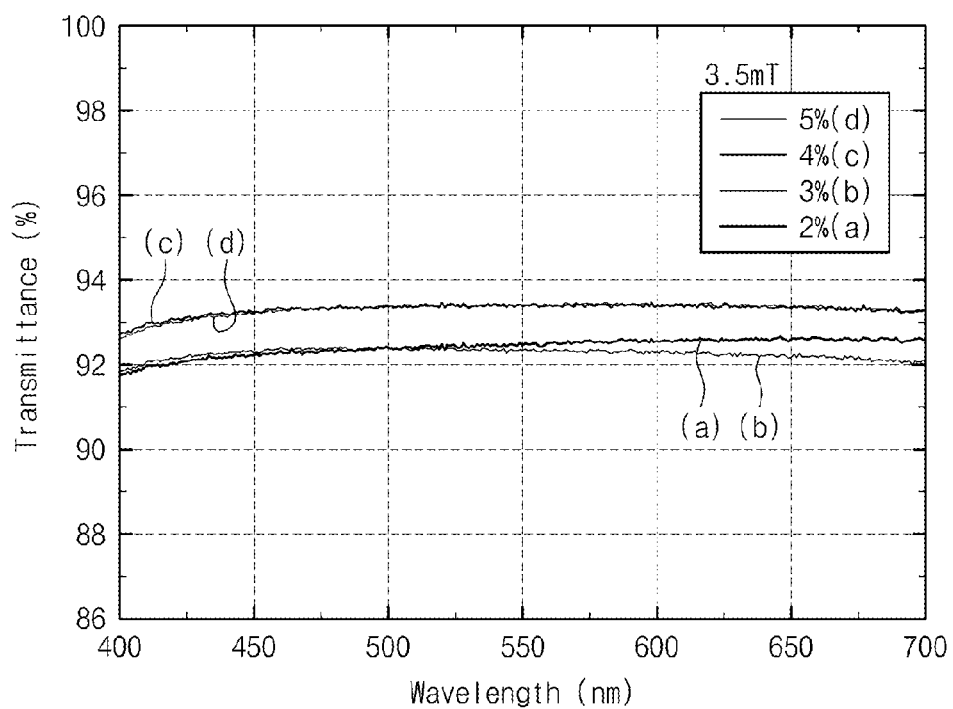

FIG. 3 is a graph showing oxygen partial pressure dependency of SiOC transmittance, according to example embodiments of the inventive concept.

Referring to FIG. 3, a SiOC layer was formed using a plasma-enhanced chemical vapor deposition, in which a RF plasma power and a pressure of 3.5 mT was fixed and a partial pressure of oxygen was varied from 2% to 5%. As a result, the SiOC layer was formed to have a thickness of about 55 nm and a refractive index of about 1.42 to about 1.44.

As shown in curves c and d, transmittance of the SiOC layer was about 93% when it was formed under the condition of the Ar/$O_2$ partial pressure of 4% and 5%. That is, transmittance of the SiOC layer was higher by about 1% than that of glass (i.e., 92%).

Figure 4:
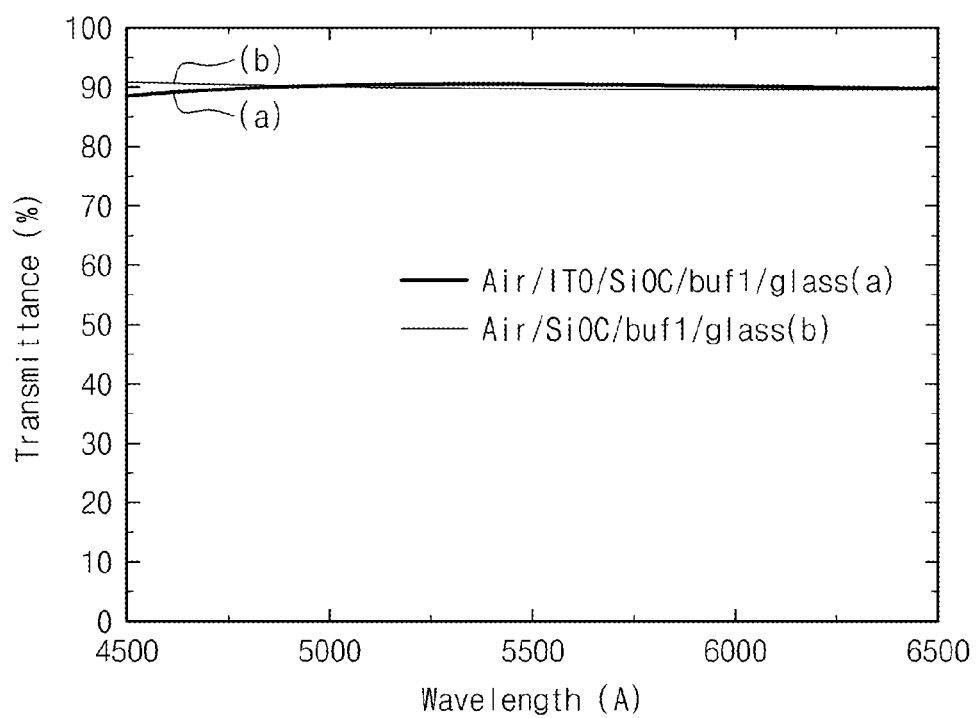

FIG. 4 is a graph showing a difference in transmittance between touch panels with and without an ITO layer.

In samples used in the experiment, refractive indices of a first buffer layer (buf1), a SiOC layer, and an ITO layer were 1.66, 1.44, and 1.98, respectively. Thicknesses of the first buffer layer, the SiOC layer, and the ITO layer were 30 nm, 61 nm, and 30 nm. In the graph, curves (a) and (b) were obtained from two regions, respectively, provided with and without the ITO layer. For example, the curves (a) and (b) may be obtained from regions depicted by arrows (C) and (D) of FIG. 2C.

Referring to FIG. 4, around the wavelength range of about 550 nm, the curve (a) had a transmittance of 90.4% and an index matching between the curves (a) and (b) was 0.5%. Further, the regions (a) and (b) had uniform transmittance of about 90% over almost the entire wavelength range.

FIG. 5 is a table exemplarily showing relationship among a thickness of the SiOC layer and a thickness and a refractive index of the first buffer layer (buf1). For example, the table of FIG. 5 may be used to determine optimized characteristics of a touch panel according to a variation in thickness of the ITO layer.

Referring to FIG. 5, for the ITO layer of 20 nm, if the SiOC layer has a thickness of 30 nm-90 nm and the first buffer layer has a refractive index range of 1.6-2.7 and a thickness range of 3 nm-90 nm, it is possible to achieve high transmittance of 90% or more and an index matching of 0.8% or less.

According to example embodiments of the inventive concept, a touch screen panel may include a second buffer layer made of a SiOC material. Due to the use of the SiOC material, it is possible to prevent pollution problems of the touch panel and/or chamber from occurring when the touch screen panel is fabricated using a continuous deposition process. This enables to improve characteristics (e.g., index matching and transmittance) of the touch screen panel.

While example embodiments of the inventive concepts have been particularly shown and described, it will be understood by one of ordinary skill in the art that variations in form and detail may be made therein without departing from the spirit and scope of the attached claims.

What is claimed is:

1. A touch screen panel, comprising:
a first buffer layer and a second buffer layer sequentially stacked on a substrate;
x-axis electrodes arranged along an x-axis direction on the second buffer layer;
y-axis electrode cells spaced apart from the x-axis electrodes and arranged along a y-axis direction on the second buffer layer;
insulating patterns covering the x-axis electrodes positioned between the y-axis electrode cells; and
a bridge electrode provided on the insulating pattern to connect the y-axis electrode cells with each other,
wherein the second buffer layer is formed of a SiOC material.

2. The touch screen panel of claim 1, wherein the x-axis electrodes and the y-axis electrode cells are formed of an indium tin oxide (ITO) layer.

3. The touch screen panel of claim 2, wherein thicknesses of the x-axis electrodes and the y-axis electrode cells range from 10 nm to 100 nm.

4. The touch screen panel of claim 1, wherein the first buffer layer is formed of $TiO_2$, $Nb_2O_5$, $ZrO_2$, $Ta_2O_5$, or $HfO_2$.

5. The touch screen panel of claim 1, wherein the first buffer layer has a thickness of 3 nm to 100 nm.

6. The touch screen panel of claim 1, wherein the first buffer layer has a refractive index of 1.6 to 2.7.

7. The touch screen panel of claim 1, wherein the second buffer layer has a thickness of 5 nm to 100 nm.

8. The touch screen panel of claim 1, wherein the second buffer layer has a refractive index of 1.4 to 1.48.

* * * * *